United States Patent
Li et al.

(10) Patent No.: US 9,784,812 B2
(45) Date of Patent: Oct. 10, 2017

(54) METHOD TO ENTER MAGNETIC RESONANCE DATA INTO A MEMORY ORGANIZED AS K-SPACE, AND MAGNETIC RESONANCE APPARATUS OPERATING ACCORDING TO THE METHOD

(71) Applicant: Siemens Aktiengesellschaft, Munich (DE)

(72) Inventors: Guobin Li, Freiburg (DE); Esther Meyer, Erlangen (DE); Dominik Paul, Bubenreuth (DE)

(73) Assignees: Siemens Aktiengesellschaft, Munich (DE); Albert-Ludwigs-Universität Freiburg, Freiburg (DE)

( * ) Notice: Subject to any disclaimer, the term of this patent is extended or adjusted under 35 U.S.C. 154(b) by 778 days.

(21) Appl. No.: 14/228,542

(22) Filed: Mar. 28, 2014

(65) Prior Publication Data
US 2014/0300352 A1    Oct. 9, 2014

(30) Foreign Application Priority Data

Apr. 3, 2013    (DE) .................. 10 2013 205 868

(51) Int. Cl.
*G01V 3/00*    (2006.01)
*G01R 33/56*    (2006.01)
(Continued)

(52) U.S. Cl.
CPC ..... *G01R 33/5608* (2013.01); *G01R 33/5617* (2013.01); *G06T 11/005* (2013.01); *G01R 33/4822* (2013.01); *G01R 33/5611* (2013.01)

(58) Field of Classification Search
CPC ............ G01R 33/5608; G01R 33/4835; G01R 33/4828; G01R 33/543; A61B 5/055
(Continued)

(56) References Cited

U.S. PATENT DOCUMENTS 6,414,487 B1    7/2002    Anand et al.
2005/0251023 A1*    11/2005    Kannengiesser .. G01R 33/5611
                                                                    600/410
(Continued)

OTHER PUBLICATIONS

Busse et al., "Flexible and Efficient View Ordering for 3D Sequences with Periodic Signal Modulation," Proc. Intl. Soc. Mag. Reson. Med., vol. 16 (2008), p. 837.
(Continued)

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

In a method to associate k-space lines with echo trains of raw magnetic resonance data, parallel k-space lines orthogonally intersect a plane at respective intersection points. Each echo train has a trajectory length, and the k-space lines are associated with the echo trains such that a sum of trajectory lengths of all echo trains is minimal. The trajectory length TL of an echo train is defined by $$TL = \sum_{i=1}^{L-1} \overline{P_i P_{i+1}}$$

wherein L is a sequence of k-space lines, $P_i$ is an intersection point of the i-th k-space line of the echo train with the plane; and $\overline{P_i P_{i+1}}$ is the length of the path from the i-th intersection point to the (i+1)-th intersection point.

31 Claims, 4 Drawing Sheets

(51) Int. Cl.
*G06T 11/00* (2006.01)
*G01R 33/48* (2006.01)
*G01R 33/561* (2006.01)

(58) Field of Classification Search
USPC .......................................................... 324/309
See application file for complete search history.

(56) References Cited

U.S. PATENT DOCUMENTS

| | | | |
|---|---|---|---|
| 2007/0287907 A1* | 12/2007 | Spincemaille | A61B 5/0263 600/413 |
| 2008/0061779 A1* | 3/2008 | Feiweier | G01R 33/4818 324/307 |
| 2009/0069664 A1* | 3/2009 | Kim | G01R 33/561 600/410 |
| 2010/0164493 A1* | 7/2010 | Li | G01R 33/56509 324/309 |
| 2010/0237864 A1 | 9/2010 | Stemmer | |
| 2010/0264924 A1 | 10/2010 | Stemmer | |
| 2012/0019247 A1 | 1/2012 | Boernert et al. | |
| 2013/0002248 A1 | 1/2013 | Koay et al. | |

OTHER PUBLICATIONS

Li et al., "Reducing fluctuation of train trajectories in 3D TSE imaging with compressed sampling," University Medical Center Freiburg, Freiburg, Germany, Siemens Healthcare, Erlangen, Germany, p. 1545.

Busse et al., "Effects of Refocusing Flip Angle Modulation and View Ordering in 3D Fast Spin Echo," Magnetic Resonance in Medicine, vol. 60 (2008), pp. 640-649.

J. Hennig, "K-space sampling strategies," Eur. Radiol., vol. 9 (1999), pp. 1020-1031.

* cited by examiner

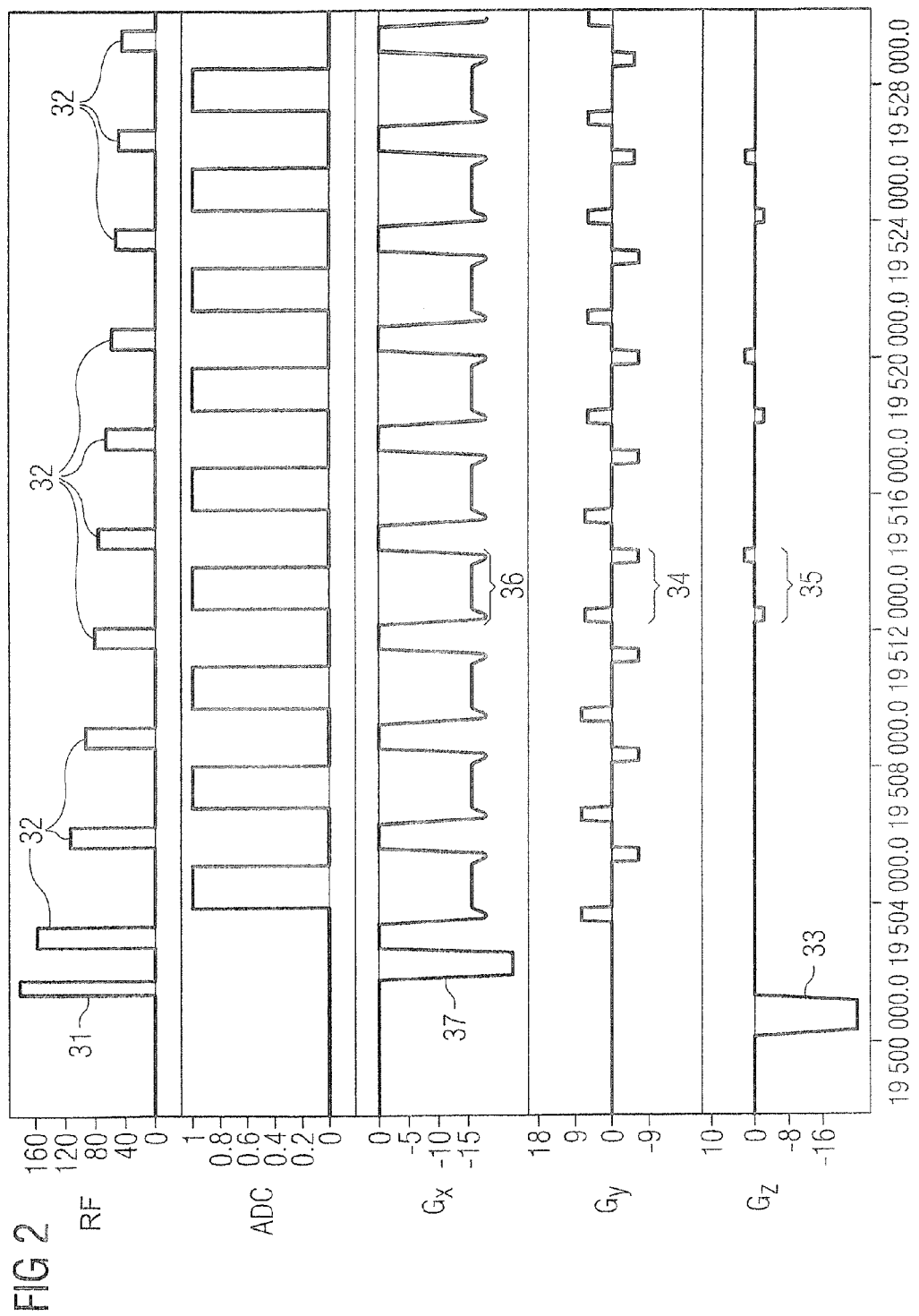

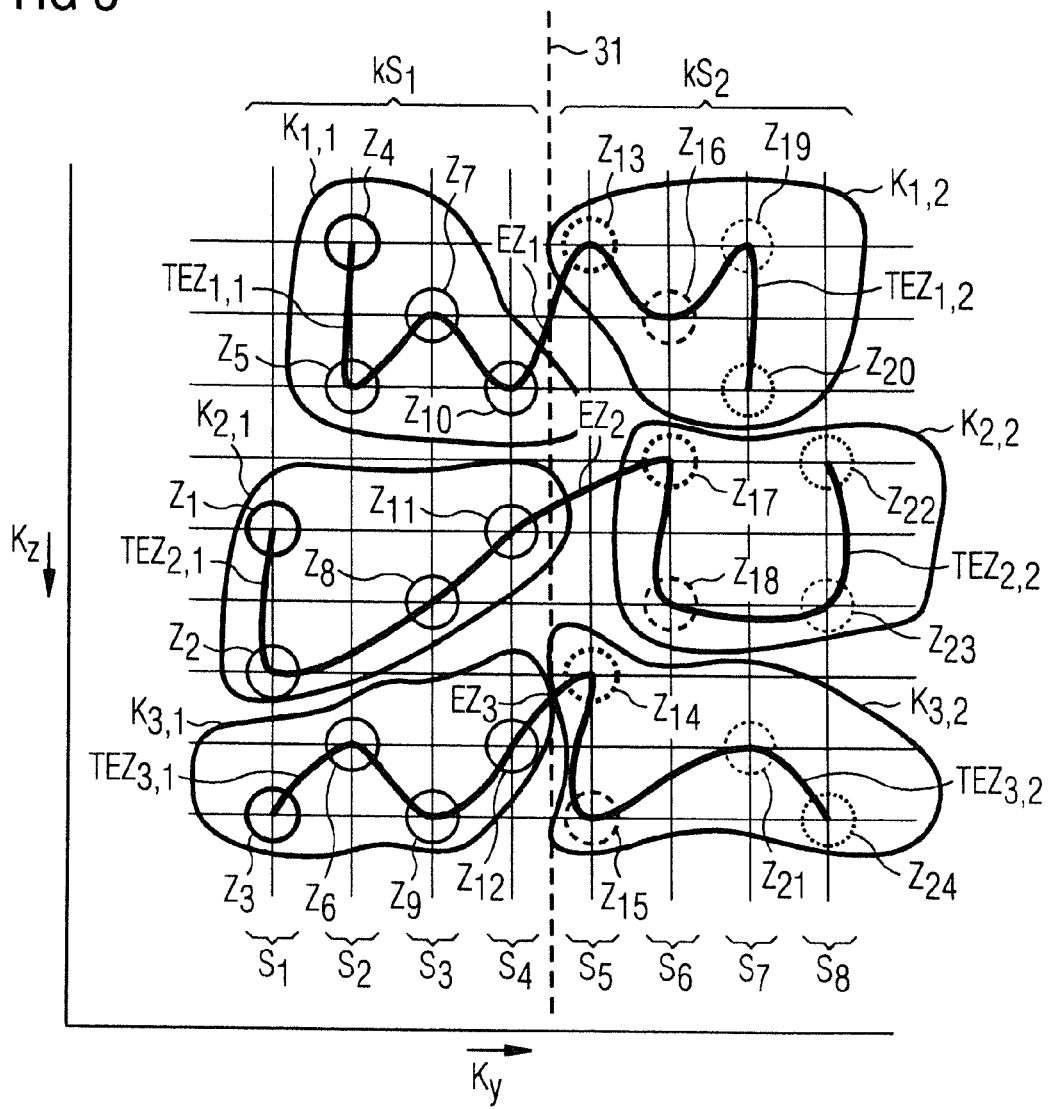

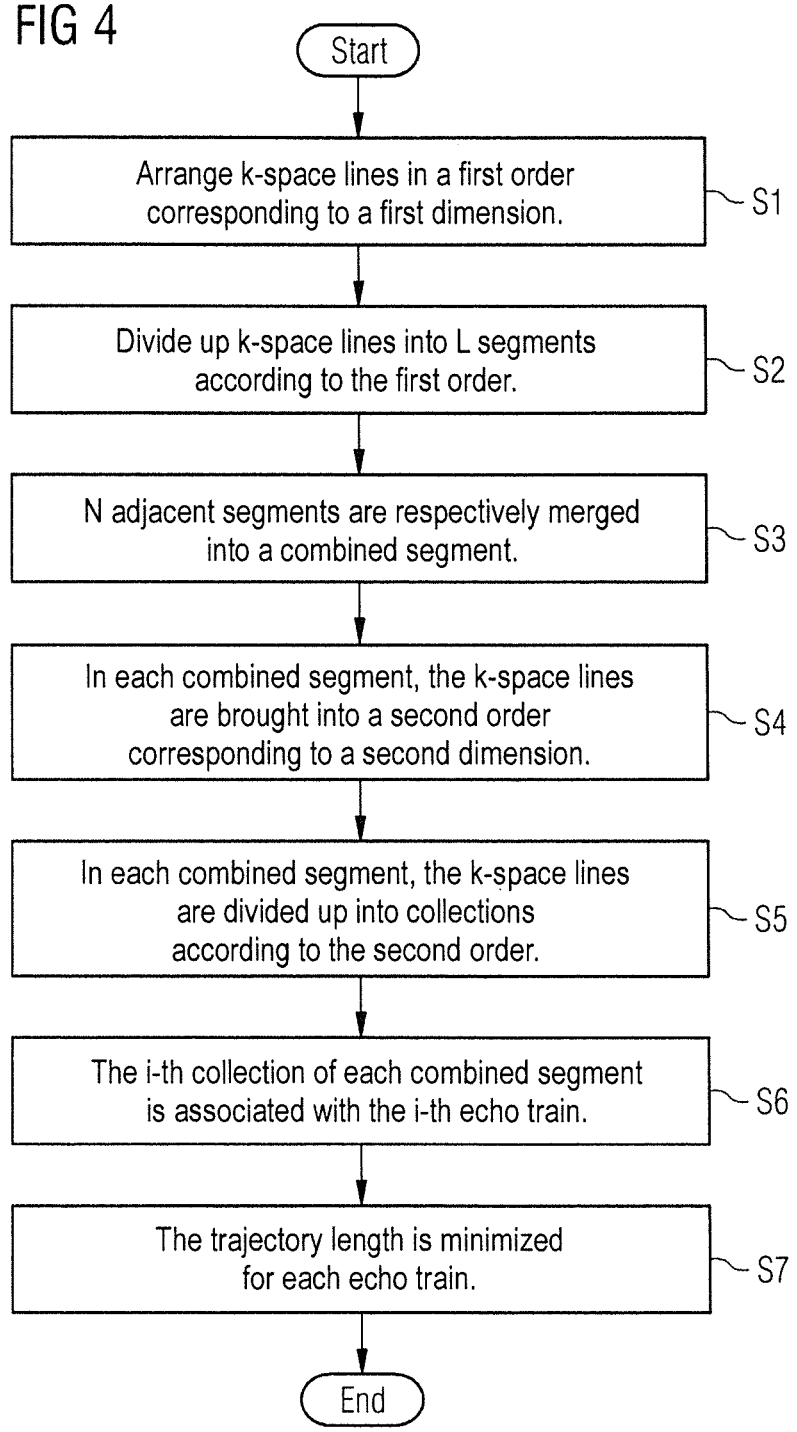

METHOD TO ENTER MAGNETIC RESONANCE DATA INTO A MEMORY ORGANIZED AS K-SPACE, AND MAGNETIC RESONANCE APPARATUS OPERATING ACCORDING TO THE METHOD

BACKGROUND OF THE INVENTION

Field of the Invention

The present invention concerns a method to enter magnetic resonance data, acquired during respective echoes of a data acquisition sequence, into a memory organized as k-space, with respective k-space lines being associated with respective echo trains. The invention also concerns a method to acquire MR data with a magnetic resonance system, wherein the acquired data are entered into k-space according to the first cited method. Moreover, the present invention concerns a correspondingly designed magnetic resonance system.

Description of the Prior Art

A coherent undersampling of k-space is used for PAT ("Parallel Acquisition Technique"), for example, and an incoherent undersampling of k-space is used for compressed sensing, for example, in order to accelerate the acquisition MR data with a magnetic resonance system. For example, the undersampling can be used for three-dimensional turbo spin echo sequences (for example SPACE, "Sampling Perfection with Application optimized Contrasts using different flip angle Evolutions"), wherein—as before—the duration to acquire MR data represents a problem in the everyday clinical routine, in spite of the application of PAT. Given incoherent undersampling for compressed sensing, k-space must be scanned (filled with acquired data) in the form of irregular scan patterns, and a k-space line in the k-space center must be scanned at the echo time (TE) in each echo train, in order to achieve a defined contrast in the reconstructed MR images. The association of k-space lines with the echo trains is therefore an important step, in particular given three-dimensional turbo spin echo sequences and in particular given incoherent undersampling.

SUMMARY OF THE INVENTION

An object of the present invention is to distribute a predetermined (by the compressed sensing, for example) set of k-space lines among a defined number of echo trains, such that, optimally, only slight fluctuations or movements occur within the respective echo train.

Within the scope of the present invention, a method is provided to associate predetermined k-space lines with echo trains. The k-space lines are thereby scanned with these echo trains by operation of a magnetic resonance system. The k-space lines proceed in parallel through k-space and intersect a plane that is orthogonal to each k-space line, such that each k-space line has its own intersection point with this plane. Each echo train has a trajectory length TL defined by the following Equation (1).

$$TL = \sum_{i=1}^{L-1} \overline{P_i P_{i+1}} \quad (1)$$

L is the echo train length of the echo train (which is equal for all echo trains) $P_i$ is the intersection point of the i-th k-space line of the echo train with the plane, and $\overline{P_i P_{i+1}}$ is the length of the path from the i-th intersection point to the (i+1)-th intersection point. The echo train scans (causes acquired data to be entered into) the k-space lines associated with it in the order sequence of first k-space line, second k-space line, L-th k-space line, wherein this order is provided by the trajectory of the respective echo train. The k-space lines are associated with the echo trains such that a sum of the trajectory lengths of all echo trains is as small as possible (minimal).

When the sum of the trajectory length of the echo trains is minimal, on average, only slight fluctuations or movements occur in the respective echo train. Eddy currents and peripheral nerve stimulation are thereby reduced, specifically given the use of strong gradients.

The trajectory length of an echo train can also be viewed as the sum of the shortest distances from the i-th k-space line to the (i+1)-th k-space line (for i=1 through L=1).

The invention is used in particular to associate more than 1000 k-space lines with echo trains that each have an echo train length of more than 50.

According to a preferred embodiment of the invention, each echo train traverses a central region of k-space in order to scan a k-space line within the central region at its echo time TE. The definition of the central region depends on the way that the echo trains are arranged. A differentiation is made between a linear arrangement of the echo trains (wherein the echo trains are arranged essentially in parallel within the plane) and a radial arrangement of the echo trains (wherein each echo train in the plane that starts from one edge of k-space traverses a region around a middle axis of k-space, like a spoke, in order to end at the opposite edge of k-space. Given linear arrangement of the echo trains, the central region corresponds to a line which (in the plane situated essentially orthogonal to the echo trains) traverses the entirety of k-space in order to divide an area in the plane which is bounded by k-space into two equally large halves. Given the radial arrangement of echo trains, the central region corresponds to the area of a circle in the plane, wherein the middle point of the circle corresponds to an intersection point of a middle axis of k-space which is orthogonal to the plane. The area of the circle thereby corresponds to at most 10% (only 5% is better) of the area in the plane which is bounded by k-space.

In that each echo train scans a k-space line within the central region of k-space at its echo time, the contrast of an MR image reconstructed from the MR data acquired in such a manner can be improved in comparison to a scan which does not comply with this condition.

In particular, each echo train travels from a first edge of k-space to a second edge of k-space which is situated opposite the first edge.

According to a first embodiment according to the invention, k-space lines are associated with the echo trains in the following manner.

The k-space lines are brought into a first order corresponding to a first dimension of the plane relative to k-space. The first dimension can correspond to a direction in a Cartesian coordinate system or a radial direction, for example given a cylindrical coordinate system.

The k-space lines are divided into a number L of segments, such that—according to the first order—the first $x_1$ k-space lines are associated with the first segment, the second $x_2$ k-space lines are associated with the second segment, . . . , and the last $x_L$ k-space lines are associated with the L-th segment. Each segment thus includes at least one k-space line. Each k-space line is associated with precisely one segment, such that the sum of the k-space lines of all segments corresponds to the number of all k-space lines. The number of segments L thereby corresponds to the echo train length.

For example, each segment can include a number M/L of k-space lines. In this variant, according to the first order, the first of the number M/L of corresponding k-space lines are associated with the first segment, the second of the number M/L of corresponding k-space lines are associated with the second segment, . . . , and the L-th of the number M/L of corresponding k-space lines are associated with the L-th segment. M corresponds to the number of all k-space lines which are to be associated with the echo trains.

At least two segments—which, according to the number of the segments, are adjacent segments (thus for example the fourth and fifth or the 164th and 165th)—are assembled into a combined segment. In other words: two, three, four or more adjacent segments are assembled into a combined segment, wherein the possibility naturally exists that additional adjacent segments are also assembled into additional combined segments.

The k-space lines in each combined segment (and in each segment which is not a component of a combined segment) are ordered in a second order according to a second dimension. The second dimension is thereby orthogonal to each k-space line and orthogonal to the first dimension. The Cartesian coordinate system corresponds to the second dimension—the y-direction, for example, if the first dimension corresponds to the X-direction. If the first dimension corresponds to the radial direction or radial coordinate, the second dimension corresponds to the angle coordinate.

The k-space lines of each segment and each combined segment are divided into collections, wherein each segment and each combined segment has the same number K of collections.

In each segment which is not a component of a combined segment, the collections are created as follows. Corresponding to the second order, the $y_1$ first k-space lines of the respective segment are associated with the first collection, the $y_2$ second k-space lines of the respective segment are associated with the second collection, . . . , and the $y_K$ last k-space lines of the respective segment are associated with the last or, respectively, K-th collection. Each collection of the respective segment thereby comprises at least one k-space line. Each k-space line of the respective segment is assigned to precisely one collection, such that the sum of the number of k-space lines of the collections of the respective segment corresponds to the number of all k-space lines of the respective segment. It is possible that each collection of the respective segment comprises an identical number of k-space lines.

In each combined segment, corresponding to the second order the first $z_1$ k-space lines are associated with the first collection, the second $z_2$ k-space lines are associated with the second collection, . . . , and the last $z_K$ k-space lines are associated with the K-th collection. Each collection of the respective combined segment thereby comprises at least one k-space line. Each k-space line of the respective combined segment is assigned to precisely one collection, such that the sum of the number of k-space lines of all collections of the respective combined segment corresponds to the number of all k-space lines of the respective combined segment. It is again possible that each collection of the respective segment comprises an identical number of k-space lines.

Starting from the collections, the k-space lines are now associated with the respective echo train. The k-space line(s) of the i-th collection of each segment and the k-space line(s) of the i-th collection of each combined segment is/are thereby associated with the i-th echo train. For example, the k-space line(s) of the fifth collection of each segment and the k-space line(s) of the fifth collection of each combined segment is/are associated with the fifth echo train.

The k-space lines of each echo train are sorted such that the trajectory length of the respective echo train is minimal.

According to a second preferred embodiment according to the invention, the k-space lines are associated with the echo trains in the following manner.

The k-space lines are placed in a first order corresponding to the first dimension. This step corresponds to the corresponding step of the first embodiment.

The k-space lines are divided up into a number L of segments (meaning that each k-space line is allocated to precisely one of L segments), such that—according to the first order—the first of the number M/L of corresponding k-space lines is associated with the first segment, the second of the number M/L of corresponding k-space lines is associated with the second segment, . . . , and the L-th of the number M/L of corresponding k-space lines is associated with the L-th segment. M thereby corresponds to the number of all k-space lines which are to be associated with the echo trains. This step also corresponds to the corresponding step of the first embodiment.

The first N segments are associated with a first combined segment; the second N segments are associated with a second combined segment; . . . , and the (L/N)-th segments are associated with an (L/N)-th combined segment, wherein N>1. For example, the first three segments (i.e. the first through third segments) are associated with the first combined segment; the second three segments (i.e. the fourth through sixth segments) are associated with the second combined segment etc. (if N=3). This step differs from the corresponding step of the first embodiment since here each combined segment comprises the same number of segments, and each segment is associated with a combined segment.

The k-space lines in each combined segment are placed in a second order according to the second dimension. This step corresponds in principle to the corresponding step of the first embodiment.

The k-space lines of each combined segment are divided up into O/N collections, wherein O corresponds to the number of k-space lines of the combined segment. Corresponding to the second order, the first N k-space lines are associated with the first collection, the second N k-space lines are associated with the second collection, . . . , and the (O/N)-th k-space lines are associated with the (O/N)-th collection. This step also corresponds in principle to the corresponding step of the first embodiment.

Starting from the collections, the k-space lines are now associated with the respective echo train. The k-space line(s) of the i-th collection of each combined segment are thereby associated with the i-th echo train. For example, the k-space lines of the fifth collection of the first through last combined segment are associated with the fifth echo train.

The k-space lines of each echo train are sorted such that the trajectory length of the respective echo train is minimal. The two last steps also corresponding in principle to the corresponding steps of the first embodiment.

While the first embodiment on the one hand leaves it open to question whether one segment is associated or not with another segment a combined segment [sic], and on the other hand leaves it open to question how many segments are associated with a combined segment, in the second embodiment it is clearly defined that each segment is associated with precisely one combined segment, and that each combined segment comprises precisely N segments. In contrast to this, the type and manner of the second embodiment (how the echo paths are constructed based on the combined segments) corresponds to the type and manner of the first embodiment (how the echo paths are constructed based on the segments and combined segments).

In the first and second embodiment, the sorting of the k-space lines of each echo train can be simplified as follows in order to save on calculation time, for example:

The k-space lines of each collection of the respective echo train are associated with a partial echo train, and sorted such that the trajectory length of the respective partial echo train.

The partial echo train of the first collection, the partial echo train of the second collection, . . . , the partial echo train of the last or, respectively, (O/N)-th collection are connected in this order with a respective echo train.

In this variant, the echo train is created according to the order of its collections, meaning that its first collection forms the first part or, respectively, partial echo train, its second collection forms the second part etc., up to its last collection forming the last part. The k-space lines within each collection are sorted so that the corresponding partial echo train has a minimal trajectory length. Multiple possibilities exist for the connection of two adjacent partial echo trains. This connection can be realized such that the echo train itself has a minimal trajectory length. Another possibility exists in connecting the two ends of the two partial echo trains to be connected which have the shortest distance from one another.

In comparison to the procedure described above, this variant has the advantage that a reasonable limitation is provided by the requirement that the i-th collection defines the i-th part of the respective echo train, such that the computing time to sort the k-space lines of the respective echo train is markedly reduced.

According to a further procedure according to the invention, which can be viewed as a variation of the variant described in the preceding, the k-space lines of each echo train are sorted as follows:

The k-space lines of the first collection of the respective echo train are sorted so that the trajectory length of a partial echo train comprising these k-space lines is minimal. This partial echo train forms the first part or, respectively, partial echo train of the respective echo train.

The second through last partial echo train of the respective echo train is created based on the second through last collection of the respective echo train. However, the last k-space line (corresponding to the first dimension) of the previous ((i−1)-th) partial echo train is thereby added to the i-th collection (i goes from 2 to O/N) as a first k-space line (thus as a start point of the next partial echo train). The (N+1) k-space lines of the respective collection are then in turn sorted such that the trajectory length of the partial echo train comprising these k-space lines is minimal, wherein (as has already been stated) it is established in advance that the last k-space line of the previous echo train is the first k-space line of this partial echo train.

The respective echo train is thus formed such that its first part is formed from the partial echo train of the first collection, its second part is formed from the partial echo train of the second collection etc., up to its last part being formed from the partial echo train of the last collection.

In this variant, the two adjacent partial echo trains are respectively already connected with one another since the last k-space line of the previous partial echo train is identical to the first k-space line of the following partial echo train.

In this variant, the first k-space line of the first partial echo train of each echo train (and therefore the first k-space line of the echo train) is advantageously the first k-space line (corresponding to the first dimension) of the first collection of the respective echo train. Expressed in a different way: the first k-space line of its first collection (order according to the first dimension) is the first k-space line of the respective echo train.

Moreover, it is advantageous if the last k-space line of each partial echo train in each partial echo train corresponds to the last k-space line (according to the first dimension) of that collection from which k-space lines of the respective partial echo train is composed.

If the last k-space line of the previous partial echo train corresponds to the first k-space line of the following partial echo train, the partial echo trains are advantageously reasonably combined with one another.

As has already been described in the preceding, the echo trains can be arranged according to a linear arrangement or according to a radial arrangement.

In the linear arrangement of the echo trains, the first dimension can correspond to a direction of a first phase encoding gradient and the second direction can correspond to a direction of a second phase encoding gradient, wherein both the first and second phase encoding gradients are used for spatial coding within the scope of a sequence to acquire the MR data by means of the echo trains and are situated orthogonal to one another.

Given the radial arrangement of the echo trains, the first M/L k-space lines correspond to those M/L k-space lines which lie closest to the middle axis. The second M/L k-space lines correspond to those M/L k-space lines which, of the remaining k-space lines (i.e. without the first M/L k-space lines) lie closest to the middle axis etc. The last M/L k-space lines correspond to those M/L k-space lines which are furthest distant from the middle axis. The first order thus corresponds to a radial direction which is direction from the middle axis outward in the plane. The second order corresponds to a sorting according to an angle coordinate. This means that the k-space lines of the respective segment or combined segment are essentially sorted corresponding to that angle which the respective k-space line has with regard to the middle axis in the plane relative to a preferred direction situated orthogonal to the middle axis in the plane.

By the combination of multiple segments into a combined segment and a sorting of the echo train corresponding to the order of the segments and combined segments, on the one hand the calculation time can be drastically shortened in comparison to a method in which the echo train does not follow the order of the segments and combined segments. Nevertheless, the respective echo train can be optimized in that the k-space lines within the combined segments are connected into optimally short partial echo trains. The present invention nevertheless achieves a good compromise between a uniform course of an echo train and the quality of the contrast in the reconstructed MR image.

As has been described in the preceding, each echo train in particular travels from one edge of k-space to an opposite edge. Therefore, given the linear arrangement the echo trains essentially travel in parallel, such that two adjacent echo trains have a similar trajectory length. This means that the trajectory length of adjacent echo trains varies at most by 10% (for example if the one echo train has a trajectory length of 1000, the trajectory length of its neighbor amounts to at least 900 and at most 1100). Given the radial arrangement, all echo trains essentially travel like spokes whose center is formed by the middle axis. Here as well it is the case that two adjacent echo trains have a similar trajectory length.

What is thereby understood by the edge of k-space is a region of k-space in which those k-space lines that are to be scanned are arranged which are situated nearest the k-space boundary in the direction of the echo trains.

Within the scope of the present invention, a method is also provided for acquisition of MR data in a predetermined three-dimensional volume segment of an examination subject with the aid of a magnetic resonance system. The method thereby includes the following steps.

A processor organizes k-space lines into which raw MR data representing the volume segment are to be entered. The k-space lines are associated with echo trains according to the method described above. The raw MR data in the respective echo trains are acquired by, for each echo train, exciting nuclear spins in the volume segment with an RF excitation pulse, and repeatedly, successively implementing the following steps in order to acquire a k-space line for the respective echo train: activating a refocusing pulse, activating a first phase encoding gradient in a first direction and a second phase encoding gradient in a second direction for spatial coding of the MR signals, and activating a readout gradient in a third direction that is orthogonal to both the first and the second direction. The MR data of a k-space line are read out while the readout gradient is activated.

Because the k-space lines, which are predetermined by a method for undersampling (for example for PAT or compressed sensing) are associated according to the invention with the respective echo trains using which the MR data are then acquired in order to reconstruct an MR image from these, the method according to the invention for the acquisition of MR data has the advantage that the MR images reconstructed from said MR data have a good contrast in spite of the slight fluctuations of the echo trains.

Within the scope of the present invention, a magnetic resonance system is also provided for the association of k-space lines with echo trains, wherein the magnetic resonance system is designed in order to acquire the k-space lines using the echo trains. The k-space lines are arranged in parallel and all intersect a plane which is arranged orthogonal to the k-space lines so that each k-space line has a respective intersection point with this plane. The magnetic resonance system comprises a basic field magnet; a gradient field system; at least one RF antenna; a control device in order to control the gradient field system and the at least one RF antenna, to record MR signals acquired with at least one RF antenna, to evaluate these measurement signals and to create MR data from these. The magnetic resonance system is designed in order to associate the k-space lines with the echo trains such that a sum of the trajectory lengths of all echo trains has a minimum. Since the trajectory length of an echo train depends on the order in which the k-space lines associated with the echo train are traversed or, respectively, scanned, not only are defined k-space lines associated with a defined echo train via the association of the k-space lines with the echo trains, but the k-space lines associated with an echo train also have an order in which the respective echo train has the minimum trajectory length. The magnetic resonance system is designed in order to scan the k-space lines associated with the respective echo train in this order.

The advantages of the magnetic resonance system according to the invention correspond to the advantages of the method according to the invention described above.

The present invention also encompasses a non-transitory, computer-readable data storage medium encoded with programming instructions or commands, which can be loaded into a memory of a programmable control device or a computer of a magnetic resonance system. All or various embodiments of the method according to the invention that are described in the preceding can be executed when the programming instructions are executed by the control device. The programming instructions may require other program means (for example libraries and auxiliary functions) in order to realize the corresponding embodiments of the method. The programming instructions can be a source code (C++, for example) that still needs to be compiled and linked or that only needs to be interpreted, or can be an executable software code that has only to be loaded into the corresponding computer or control device for execution.

The electronically readable data storage medium can be, for example, a DVD, a magnetic tape or a USB stick on which is stored electronically readable control information.

The present invention is particularly suitable for creating MR images of a three-dimensional volume segment by means of compressed sensing. Naturally, the present invention is not limited to this preferred field of application since the present invention can also be applied if the k-space lines are not predetermined by the compressed sensing.

BRIEF DESCRIPTION OF THE DRAWINGS

FIG. 2 is a sequence diagram for acquiring MR data according to the invention.

FIG. 3 illustrates k-space lines associated with echo trains in accordance with the invention.

FIG. 4 is a flowchart of an embodiment of the method according to the invention for the association of k-space lines with echo trains.

DESCRIPTION OF THE PREFERRED EMBODIMENTS

Figure 1:
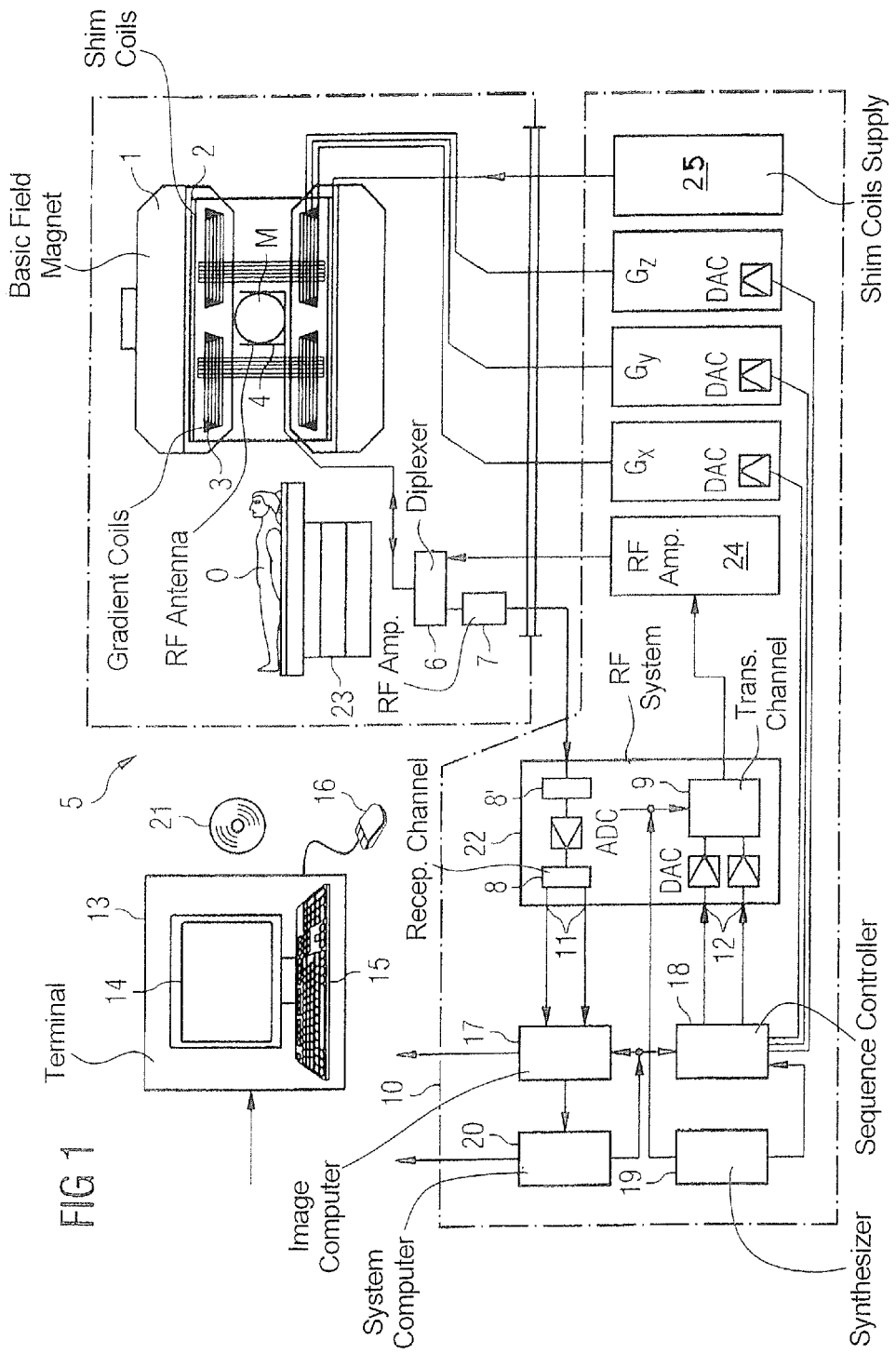
FIG. 1 shows a magnetic resonance (MR) system according to the invention.

FIG. 1 is a schematic depiction of a magnetic resonance system 5 (of a magnetic resonance or tomography apparatus). A basic field magnet 1 thereby generates a temporally constant, strong magnetic field for polarization or alignment of the nuclear spins in a volume segment of a subject O (for example of a part of a human body that is to be examined) lying on a table 23, in the magnetic resonance system 5. The high homogeneity of the basic magnetic field that is required for the nuclear magnetic resonance measurement is defined in a typically spherical measurement volume M in which the parts of the human body that are to be examined are arranged. To support the homogeneity requirements, and in particular to eliminate temporally invariable influences, shim plates made of ferromagnetic material are mounted at a suitable location. Temporally variable influences are eliminated by shim coils 2 fed by a shim coils supply 25.

In the basic field magnet 1, a cylindrical gradient coil system 3 is used that has three sub-windings. Each sub-winding is supplied by an amplifier with current to generate a linear (also temporally variable) gradient field in a respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each amplifier has a digital/analog converter that is controlled by a sequence controller 18 for accurately-timed generation of gradient pulses.

Situated within the gradient field system 3 are one or more radio-frequency antennas 4, which convert the radio-frequency pulses emitted by a radio-frequency power amplifier 24 into an alternating magnetic field for excitation of the nuclei and alignment of the nuclear spins of the subject O to be examined or of the region of the subject O that is to be examined. The antennas 4 may also detect an MR signal. Each radio-frequency antenna 4 has one or more RF transmission coils and one or more RF reception coils in the form of an annular (advantageously linear or matrix-like) arrangement of component coils. The alternating field emanating from the precessing nuclear spins—i.e. normally the nuclear spin echo signals caused by a pulse sequence made up of one or more radio-frequency pulses and one or more gradient pulses—is also converted by the RF reception coils of the respective radio-frequency antenna 4 into a voltage (measurement signal) which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system 22 via a respective inputs 12, and from the digital/analog converter to a transmission channel 9. In the transmission channel 9, the pulse sequences are modulated on a radio-frequency carrier signal whose base frequency corresponds to the center frequency.

The switching from transmission operation to reception operation takes place via a transmission/reception diplexer 6. The RF transmission coils of the radio-frequency antenna(s) 4 radiate(s) the radio-frequency pulses (resonant and non-resonant) for excitation of the nuclear spins and for generation of the B1 magnetic field into the measurement volume M, and resulting echo signals are scanned via the RF reception coil(s). The correspondingly acquired nuclear magnetic resonance signals are phase-sensitively demodulated to an intermediate frequency in a reception channel 8' (first demodulator) of the radio-frequency system 22 and digitized in an analog/digital converter (ADC). This signal is further demodulated to a frequency of 0. The demodulation to a frequency of 0, and the separation into real part and imaginary part, occur in a second demodulator 8 in the digital domain. An MR image or three-dimensional image data set is reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 controls the accurately-timed switching (activation) of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to associate the predetermined k-space lines with the echo trains and to generate an MR image (which control programs are stored on a DVD 21, for example), and the presentation of the generated MR image, take place via a terminal 13, which has a keyboard 15, a mouse 16 and a monitor 14.

A pulse sequence according to the invention is presented in FIG. 2.

After a spoiler gradient 33 to destroy "old" magnetization, an RF excitation pulse 31 is switched in order to excite the spins within the predetermined three-dimensional volume segment. The gradient pulse 37 switched in the direction of the x-axis serves to prepare the magnetization before the readout in that the magnetization is dephased before the following refocusing pulse 32.

The MR data in k-space are subsequently read out (wherein the k-space corresponds with the volume segment). To read out (enter data into) a k-space line in the x-direction, a refocusing pulse 32 is respectively switched which is followed by a gradient pulse 34 in the y-direction and a gradient pulse 35 in the z-direction. These two gradient pulses or phase encoding gradients 34 and 35 serves for phase encoding. A k-space line is read out with these two phase encoding gradients 34 and 35, wherein for this a magnetic field gradient 36 is switched in the direction of the x-axis. ADC ("Analog/Digital Conversion") indicates in which time intervals the MR data are acquired and digitized.

After only a one-time switching of the RF excitation pulse 31, 120 or more non-selective refocusing pulses 32 (and therefore 120 or more k-space lines) can be read out if the flip angle of the non-selective refocusing pulses 32 is varied accordingly. The depicted sequence diagram can correspond to a SPACE sequence.

Twenty-four k-space lines $Z_1$-$Z_{24}$ are depicted in FIG. 3. Each k-space line is depicted as a point (represented as a circle) in a plane relative to which that k-space line is orthogonally situated. In other words: the depicted (circles) are the intersection points of the respective k-space lines with the plane of the drawing of FIG. 3.

In order to divide these k-space lines $Z_1$-$Z_{24}$ among three echo trains (i.e. M/L=3, as explained below), in a first step the k-space lines are sorted according to a first dimension or first direction $K_y$, which in the present case corresponds to the direction of a first phase encoding gradient. The index assigned to the respective k-space line in FIG. 3 corresponds to this sorting, such that the k-space line $Z_1$ corresponds to the first k-space line, the k-space line $Z_{11}$ corresponds to the eleventh k-space line, and k-space line $Z_{24}$ corresponds to the last k-space line according to this sorting.

The k-space lines $Z_1$-$Z_{24}$ are divided into L (L=8) equally large segments, wherein L corresponds to the echo train length, i.e. the number of k-space lines associated with an echo train. For this purpose, the first M/L (i.e. 24/8=3) k-space lines $Z_1$-$Z_3$ corresponding to the first order are associated with the first segment $S_1$, the second M/L k-space lines $Z_4$-$Z_6$ corresponding to the first order are associated with the second segment $S_2$, etc., and the last M/L k-space lines $Z_{22}$-$Z_{24}$ are associated with the L-th or last segment $S_8$. The constant M corresponds to the number of all k-space lines, meaning that M=24 applies in the example of FIG. 3.

N (N=4) segments are respectively associated with a combined segment $kS_1$; $kS_2$. The number N can be considered as a measure of ambiguity, because the number of variation possibilities for arrangement of the k-space lines associated with the respective echo train increases with the number N in a defined order in which the k-space lines are then scanned. The number N is a natural number greater than 1.

To form the combined segments, the first N (4) segments $S_1$-$S_4$ are associated with the first combined segment $kS_1$, the second N segments $S_5$-$S_8$ are associated with the second combined segment $kS_2$ etc. Because there are only eight segments $S_1$-$S_8$ (and therefore only two combined segments kS$_1$, kS$_2$) in the example of FIG. 3, the first four segments S$_1$-S$_4$ are associated with the first combined segment kS$_1$ and the last four segments S$_5$-S$_8$ are associated with the second combined segment.

The k-space lines in each combined segment are brought into a second order corresponding to a second dimension. The second dimension is thereby arranged orthogonal to each k-space line and orthogonal to the first dimension. In the present example (see FIG. 3), the second dimension of the direction K$_z$ corresponds to a second phase encoding gradient.

The k-space lines of each combined segment kS$_1$; kS$_2$ are divided up into O/N (i.e. 12/4=3) collections. For this, for each combined segment kS$_1$; kS$_2$ the first N (4) k-space lines (corresponding to the second order) are associated with the first collection, the second N k-space lines (corresponding to the second order) are associated with the second collection etc., and the (O/N)-th or, respectively, last N k-space lines are associated with the (O/N)-th or, respectively, last collection. The number O (O=12 applies in FIG. 3) thereby corresponds to the number of k-space lines of the combined segment kS$_1$, kS$_2$.

As is shown in FIG. 3, the first combined segment kS$_1$ includes the collections K$_{1,1}$ through K$_{3,1}$ and the second combined segment kS$_2$ includes the collections K$_{1,2}$ through K$_{3,2}$.

The k-space lines of the i-th collection of each combined segment kS$_1$; kS$_2$ are associated with the i-th echo train EZ$_1$-EZ$_3$. In other words: the k-space lines of the first collection of each combined segment are associated with the first echo train, the k-space lines of the second collection of each combined segment are associated with the second echo train etc.

After the k-space lines Z$_1$-Z$_{24}$ have been associated with the echo trains EZ$_1$-EZ$_3$, the question is now posed as to in which order the k-space lines of each echo train are scanned.

The first possibility is to determine for each echo train that order of its k-space lines in which the trajectory length of the respective echo train is minimal.

A second possibility is to associate the k-space lines of a collection K$_{1,1}$-K$_{3,2}$ with a partial echo train TEZ$_{1,1}$-TEZ$_{3,2}$, and to sort the order of the k-space lines with each partial echo train such that the trajectory length of each partial echo train is minimal. For example, adjacent partial echo trains of the same echo train can then be connected such that the trajectory length of the respective echo train is minimal.

A third possibility is to sort the k-space lines of the first collection K$_{1,1}$; K$_{2,1}$; K$_{3,1}$ with the first partial echo train TEZ$_{1,1}$; TEZ$_{2,1}$; TEZ$_{3,1}$ of the respective echo train EZ$_1$-EZ$_3$, and to sort the order of the k-space lines of this first partial echo train such that the trajectory length of this first partial echo train is minimal. Given this possibility, not only the k-space lines of the i-th collection but respectively also the last k-space line (corresponding to the first dimension) of the previous or (i-1)-th partial echo train are associated with the i-th partial echo train. The last k-space line of the previous partial echo train is thereby the first k-space line of the (next) partial echo train whose k-space lines are in turn sorted such that the trajectory length of the respective partial echo train is minimal. Expressed in a different way: in the third possibility, the first k-space line of a partial echo train is respectively formed by the last k-space line of the previous partial echo train so that the partial echo trains of each echo train are automatically combined into one echo train.

The first k-space line of the first partial echo train is thereby advantageously formed by the first k-space line of the first collection, which first k-space line corresponds to the first dimension (which can also be viewed as a direction of the echo train to be constructed).

In FIG. 3, a line which identifies the central region of k-space is designated with the reference character 31. Each echo train EZ$_1$-EZ$_3$ should scan a k-space line which is arranged in proximity to this line 31 at its echo time TE.

A flowchart of a method according to the invention for the association of k-space lines with echo trains is shown in FIG. 4.

In a first Step S1, the predetermined k-space lines are arranged in a first order according to a first dimension. The k-space lines are subsequent subdivided into L (L=echo train length) segments under consideration of the first order. In the next Step S3, N adjacent segments are respectively merged into a combined segment before the k-space lines in each combined segment are brought into a second order (corresponding to a second dimension) in Step S4. Under consideration of this second order, in Step S5 the k-space lines of each combined segment are divided up into different collections, wherein the number of these collections per combined segment corresponds to the number of echo trains. The k-space lines of the i-th collection of each combined segment are associated with the i-th echo train in Step S6. Finally, in Step S7 the order of the k-space lines of each echo train is optimized such that the trajectory length of each echo train is minimized.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method of entering raw magnetic resonance (MR) data into an electronic memory representing k-space, said raw MR data having been acquired by operating an MR apparatus according to a data acquisition sequence wherein the raw MR data are read out as a plurality of echo trains, said method comprising:

in a processor supplied with said raw MR data, organizing data entry points for said raw MR data in k-space represented in said electronic memory along a plurality of parallel k-space lines that each intersect a plane that is orthogonal to each of said k-space lines, with each k-space line intersecting the plane at a respective intersection point;

via said processor, entering said raw MR data at respective data entry points along, for each of said echo trains, a k-space trajectory, having a trajectory length TL, that proceeds through a number L of k-space lines;

in said processor, automatically setting the respective number L of k-space lines associated with each respective echo train in order to cause a sum of all of the respective trajectory lengths of the respective echo trains to be as small as possible, with TL, for each echo train, defined as:

$$TL = \sum_{i=1}^{L-1} \overline{P_i P_{i+1}}$$

wherein P$_i$ is the intersection point of an i-th k-space line of the respective echo train with the plane, and $\overline{P_i P_{i+1}}$ is a length along the trajectory of the respective echo train, from the i-th intersection point to the (i+1)-th intersection point of the respective echo train with the plane; and via said processor, making said raw MR data entered into k-space available in electronic form for further processing thereof.

2. A method as claimed in claim 1 comprising:

via said processor, entering said raw MR data representing the respective echo trains in a linear arrangement in k-space, with the raw MR data acquired during an echo time of each echo train being entered into a central region of k-space in a k-space line in said central region, with said central region being represented as a line in said plane that proceeds through an entirety of k-space and divides a projection of k-space onto said plane into two equal halves.

3. A method as claimed in claim 2 comprising, via said processor, organizing said echo trains in k-space so that each echo train proceeds in said plane from a first edge of k-space to a second edge of k-space that is situated opposite to said first edge.

4. A method as claimed in claim 1 comprising:

via said processor, entering said raw MR data representing the respective echo trains in a radial arrangement in k-space, with the raw MR data acquired during an echo time of each echo train being entered into a central region of k-space in a k-space line in said central region; and in said processor, defining said central region of k-space by defining a line in said plane that traverses an entirety of k-space and divides a projection of k-space onto said plane into two equal halves, and defining a circle in said plane having a middle point corresponding to a center of said projection, with said circle having an area comprising at most 10% of an area of said projection.

5. A method as claimed in claim 4 comprising, via said processor, organizing said echo trains in k-space so that each echo train proceeds in said plane from a first edge of k-space to a second edge of k-space that is situated opposite to said first edge.

6. A method as claimed in claim 1 comprising, via said processor:

organizing the k-space lines are brought into a first order corresponding to a first dimension ($K_y$) within k-space, with the first dimension arranged in a first order, and the first dimension being orthogonal to each k-space line;

dividing the k-space lines into L segments such that, according to the first order, first $x_1$ k-space lines are associated with a first segment, the second $x_2$ k-space lines are associated with a second segment, . . . , and last $x_L$ k-space lines are associated with an L-th segment, wherein for each segment $xi \geq i$ is valid for $i \in \{1, 2, \ldots, L\}$, and wherein $$\sum_{i=1}^{L} x_i = M,$$

wherein M is a total number of all k-space lines;

assembling at least two adjacent segments among the L segments into a combined segment;

ordering the k-space lines in each combined segment, and in each segment that is not a component of a combined segment, with a second order according to a second dimension ($K_2$), with the second dimension ($K_2$) being orthogonal to each k-space line and orthogonal to the first dimension ($K_y$), dividing the k-space lines of each segment that is not a component of a combined segment into a number K of collections so that, corresponding to the second order, first $y_1$ k-space lines are associated with a first collection, second $y_2$ k-space lines are associated with a second collection, . . . , and last $y_K$ k-space lines are associated with a last yK collection, wherein for each collection $y_i \geq 1$ is valid for $i \in \{1, 2, \ldots, K\}$;

dividing the k-space lines of each combined segment into a number K of further collections so that, corresponding to the second order ($K_Z$), first $z_1$ k-space lines are associated with a first further collection, second $z_2$ k-space lines are associated with a second further collection, . . . , and last $z_K$ k-space lines are associated with a last further collection;

associating the k-space lines of the i-th collection of each combined segment or each segment with the i-th echo train, wherein for each $z_i \geq 1$ is valid for $i \in \{1, 2, \ldots, K\}$; and sorting the k-space lines of each echo train such that the trajectory length TL is as small as possible.

7. A method as claimed in claim 6 comprising, via said processor:

sorting the k-space lines of each echo train such that the trajectory length of a partial echo train, which includes the k-space lines of the further collections ($K_{1,1}$-$K_{3,2}$) is minimal, and such that a partial echo train that includes the k-space lines of the first collection, a partial echo train that includes the k-space lines of the second collection, and a partial echo train that includes the k-space lines of the last collection, are connected in this order with the respective echo train.

8. A method as claimed in claim 7 comprising, via said processor:

sorting the k-space lines of each respective echo train such that the k-space lines of the first collection of the respective echo train are sorted so that the trajectory length of a first partial echo train, which includes the first collection, is as small as possible, the i-th partial echo train, which includes the k-space lines of the i-th collection wherein i runs from 2 to K, is created by adding last k-space line of the previous partial echo train to the i-th collection as a first k-space line, and sorting the k-space lines of the i-th collection such that the trajectory length of the i-th partial echo train is as small as possible, and the partial echo train which includes the k-space lines of the first collection, the partial echo train which includes the k-space lines of the second collection, . . . , the partial echo train which includes the k-space lines of the last collection, are associated in this order with the respective echo train.

9. A method as claimed in claim 8 comprising, via said processor:

in said sorting of said k-space lines, making the first k-space line of the first partial echo train of each echo train, along the first dimension, the first k-space line of the k-space lines of the first collection.

10. A method as claimed in claim 9 comprising, via said processor:

in said sorting of said k-space lines, making the last k-space line of each partial echo train, along the first dimension, is the last k-space line of the k-space lines of the respective collection.

11. A method as claimed in claim 6 comprising, via said processor:
  entering said raw MR data representing the respective echo trains in a linear arrangement in k-space, with the raw MR data acquired during an echo time of each echo train being entered into a central region of k-space in a k-space line in said central region, with said central region being represented as a line in said plane that proceeds through an entirety of k-space and divides a projection of k-space onto said plane into two equal halves; and
  wherein the first dimension corresponds to a direction of a first phase encoding gradient and the second dimension corresponds to a direction of a second phase encoding gradient, wherein the first phase encoding gradient and the second phase encoding gradient are used for spatial coding in said data acquisition sequence.

12. A method as claimed in claim 6 comprising, via said processor:
  entering said raw MR data representing the respective echo trains in a radial arrangement in k-space, with the raw MR data acquired during an echo time of each echo train being entered into a central region of k-space in a k-space line in said central region;
  defining said central region of k-space by defining a line in said plane that traverses an entirety of k-space and divides a projection of k-space onto said plane into two equal halves, and defining a circle in said plane having a middle point corresponding to a center of said projection, with said circle having an area comprising at most 10% of an area of said projection; and
  wherein the first dimension is directed radially outwardly starting from a k-space line through the k-space center situated in the plane, such that the k-space lines that are associated with the first segment are innermost k-space lines, the k-space lines that are associated with the second segment are those k-space lines that are the innermost k-space lines without the k-space lines of the first segment, etc., and wherein the second dimension corresponds to a circular direction on a circle in the plane around the k-space line through the k-space center.

13. A method as claimed in claim 7 comprising, via said processor:
  sorting the k-space lines of each respective echo train such that the k-space lines of the first collection of the respective echo train are sorted so that the trajectory length of a first partial echo train, which includes the first collection is as small as possible, the i-th partial echo train, which includes the k-space lines of the i-th collection wherein i runs from 2 to K, is created by adding last k-space line of the previous partial echo train to the i-th collection as a first k-space line, and sorting the k-space lines of the i-th collection such that the trajectory length of the i-th partial echo train is as small as possible, and the partial echo train that includes the k-space lines of the first collection, the partial echo train which includes the k-space lines of the second collection, . . . , the partial echo train which includes the k-space lines of the last collection, are associated in this order with the respective echo train.

14. A method as claimed in claim 13 comprising, via said processor:
  sorting the k-space lines of each echo train such that the trajectory length of a partial echo train, which includes the k-space lines of the further collections ($K_{1,1}$-$K_{3,2}$) is minimal, and such that a partial echo train that includes the k-space lines of the first collection, a partial echo train that includes the k-space lines of the second collection, and a partial echo train that includes the k-space lines of the last collection, are connected in this order with the respective echo train.

15. A method as claimed in claim 14 comprising, via said processor:
  sorting the k-space lines of each respective echo train such that the k-space lines of the first collection of the respective echo train are sorted so that the trajectory length of a first partial echo train, which includes the first collection, is as small as possible, the i-th partial echo train, which includes the k-space lines of the i-th collection wherein i runs from 2 to K, is created by adding last k-space line of the previous partial echo train to the i-th collection as a first k-space line, and sorting the k-space lines of the i-th collection such that the trajectory length of the i-th partial echo train is as small as possible, and the partial echo train which includes the k-space lines of the first collection, the partial echo train which includes the k-space lines of the second collection, . . . , the partial echo train which includes the k-space lines of the last collection, are associated in this order with the respective echo train.

16. A method as claimed in claim 15 comprising, via said processor:
  in said sorting of said k-space lines, making the first k-space line of the first partial echo train of each echo train, along the first dimension, the first k-space line of the k-space lines of the first collection.

17. A method as claimed in claim 16 comprising, via said processor:
  in said sorting of said k-space lines, making the last k-space line of each partial echo train, along the first dimension, is the last k-space line of the k-space lines of the respective collection.

18. A method as claimed in claim 13 comprising, via said processor:
  entering said raw MR data representing the respective echo trains in a linear arrangement in k-space, with the raw MR data acquired during an echo time of each echo train being entered into a central region of k-space in a k-space line in said central region, with said central region being represented as a line in said plane that proceeds through an entirety of k-space and divides a projection of k-space onto said plane into two equal halves; and
  wherein the first dimension corresponds to a direction of a first phase encoding gradient and the second dimension corresponds to a direction of a second phase encoding gradient, wherein the first phase encoding gradient and the second phase encoding gradient are used for spatial coding in said data acquisition sequence.

19. A method as claimed in claim 13 comprising, via said processor:
  entering said raw MR data representing the respective echo trains in a radial arrangement in k-space, with the raw MR data acquired during an echo time of each echo train being entered into a central region of k-space in a k-space line in said central region;
  defining said central region of k-space by defining a line in said plane that traverses an entirety of k-space and divides a projection of k-space onto said plane into two equal halves, and defining a circle in said plane having a middle point corresponding to a center of said projection, with said circle having an area comprising at most 10% of an area of said projection; and wherein the first dimension is directed radially outwardly starting from a k-space line through the k-space center situated in the plane, such that the k-space lines that are associated with the first segment are innermost k-space lines, the k-space lines that are associated with the second segment are those k-space lines that are the innermost k-space lines without the k-space lines of the first segment, etc., and wherein the second dimension corresponds to a circular direction on a circle in the plane around the k-space line through the k-space center.

20. A method as claimed in claim 1 comprising, via said processor:

organizing the k-space lines into a first order corresponding to a first dimension ($K_y$) within k-space, the first dimension ($K_y$) being orthogonal to each k-space line;

dividing the k-space lines into L segments such that, according to the first order, the first [M/L] k-space lines are associated with a first segment, second [M/L] k-space lines are associated with a second segment, ..., and L-th [M/L] k-space lines are associated with an L-th segment, wherein M is a total number of all k-space lines;

associating first N segments with a first combined segment, associating second N segments with a second combined segment, and associating [L/N]-th N segments with an [L/N]-th combined segment, wherein N>1, ordering the k-space lines in each combined segment into a second order corresponding to a second dimension ($K_z$), the second dimension ($K_z$) being orthogonal to each k-space line and orthogonal to the first dimension;

dividing the k-space lines of each combined segment into [O/N] collections, such that, corresponding to the second order, the first N k-space lines are associated with the first collection, the second N k-space lines are associated with the second collection, ..., and the (O/N)-th N k-space lines are associated with the [O/N]-th collection, wherein O corresponds to the number of k-space lines of the combined segment;

associating the k-space lines of the i-th collection of each combined segment (with the i-th echo train; and sorting the k-space lines of each echo train such that the trajectory length is as small as possible.

21. A method as claimed in claim 20 comprising, via said processor:

sorting the k-space lines of each echo train such that the trajectory length of a partial echo train, which includes the k-space lines of the further collections ($K_{1,1}$-$K_{3,2}$) is minimal, and such that a partial echo train that includes the k-space lines of the first collection, a partial echo train that includes the k-space lines of the second collection, and a partial echo train that includes the k-space lines of the last collection, are connected in this order with the respective echo train.

22. A method as claimed in claim 21 comprising, via said processor:

sorting the k-space lines of each respective echo train such that the k-space lines of the first collection of the respective echo train are sorted so that the trajectory length of a first partial echo train, which includes the first collection, is as small as possible, the i-th partial echo train, which includes the k-space lines of the i-th collection wherein i runs from 2 to K, is created by adding last k-space line of the previous partial echo train to the i-th collection as a first k-space line, and sorting the k-space lines of the i-th collection such that the trajectory length of the i-th partial echo train is as small as possible, and the partial echo train which includes the k-space lines of the first collection, the partial echo train which includes the k-space lines of the second collection, ..., the partial echo train which includes the k-space lines of the last collection, are associated in this order with the respective echo train.

23. A method as claimed in claim 22 comprising, via said processor:

in said sorting of said k-space lines, making the first k-space line of the first partial echo train of each echo train, along the first dimension, the first k-space line of the k-space lines of the first collection.

24. A method as claimed in claim 23 comprising, via said processor:

in said sorting of said k-space lines, making the last k-space line of each partial echo train, along the first dimension, is the last k-space line of the k-space lines of the respective collection.

25. A method as claimed in claim 20 comprising, via said processor:

entering said raw MR data representing the respective echo trains in a linear arrangement in k-space, with the raw MR data acquired during an echo time of each echo train being entered into a central region of k-space in a k-space line in said central region, with said central region being represented as a line in said plane that proceeds through an entirety of k-space and divides a projection of k-space onto said plane into two equal halves; and wherein the first dimension corresponds to a direction of a first phase encoding gradient and the second dimension corresponds to a direction of a second phase encoding gradient, wherein the first phase encoding gradient and the second phase encoding gradient are used for spatial coding in said data acquisition sequence.

26. A method as claimed in claim 20 comprising, via said processor:

entering said raw MR data representing the respective echo trains in a radial arrangement in k-space, with the raw MR data acquired during an echo time of each echo train being entered into a central region of k-space in a k-space line in said central region;

defining said central region of k-space by defining a line in said plane that traverses an entirety of k-space and divides a projection of k-space onto said plane into two equal halves, and defining a circle in said plane having a middle point corresponding to a center of said projection, with said circle having an area comprising at most 10% of an area of said projection; and wherein the first dimension is directed radially outwardly starting from a k-space line through the k-space center situated in the plane, such that the k-space lines that are associated with the first segment are innermost k-space lines, the k-space lines that are associated with the second segment are those k-space lines that are the innermost k-space lines without the k-space lines of the first segment, etc., and wherein the second dimension corresponds to a circular direction on a circle in the plane around the k-space line through the k-space center.

27. A method as claimed in claim 1 comprising, via said processor, designating the k-space lines in k-space to conform to a method selected from the group consisting of compressed sensing and parallel acquisition.

28. A method to acquire magnetic resonance (MR) data, comprising:

with a computer system, operating an MR apparatus, in which an examination subject is situated, in order to acquire raw MR data from a three-dimensional volume segment of the examination subject according to a data acquisition sequence;

with said computer system, operating said MR apparatus in said data acquisition sequence by radiating a radio-frequency excitation pulse that excites nuclear spins in the volume segment, repeatedly, chronologically detecting MR raw data from the excited nuclear spins in the volume segment as echo trains following said excitation pulse by activating a refocusing pulse, activating a first phase encoding gradient in a first direction and activating a second phase encoding gradient in a second direction, and activating an additional magnetic field gradient for spatial encoding in a third direction, which is orthogonal to said first direction and to said second direction, and reading out the respective echo trains, in each repetition, while said additional magnetic field gradient is activated;

in a processor supplied with said raw MR data, organizing data entry points for said raw MR data in k-space represented in said electronic memory along a plurality of parallel k-space lines that each intersect a plane that is orthogonal to each of said k-space lines, with each k-space line intersecting the plane at a respective intersection point;

via said processor, entering said raw MR data at respective data entry points along, for each of said echo trains, a k-space trajectory, having a trajectory length TL, that proceeds through a number L of k-space lines;

in said processor, automatically setting the respective number L of k-space lines associated with each respective echo train in order to cause a sum of all of the respective trajectory lengths of the respective echo trains to be as small as possible, with TL, for each echo train, defined as:

$$TL = \sum_{i=1}^{L-1} \overline{P_i P_{i+1}}$$

wherein Pi is the intersection point of an i-th k-space line of the respective echo train with the plane, and $\overline{P_i P_{i+1}}$ is a length along the trajectory of the respective echo train, from the i-th intersection point to the (i+1)-th intersection point of the respective echo train with the plane; and via said processor, making said raw MR data entered into k-space available in electronic form for further processing thereof.

29. A method as claimed in claim 28 comprising, via said processor, designating the k-space lines in k-space to conform to a method selected from the group consisting of compressed sensing and parallel acquisition.

30. A magnetic resonance apparatus comprising:

a magnetic resonance data acquisition unit in which an examination subject is situated;

a computer system configured to operate said magnetic resonance data acquisition unit in a data acquisition sequence by radiating a radio-frequency excitation pulse that excites nuclear spins in a volume segment of the examination subject, repeatedly, chronologically detecting MR raw data from the excited nuclear spins in the volume segment as echo trains following said excitation pulse by activating a refocusing pulse, activating a first phase encoding gradient in a first direction and activating a second phase encoding gradient in a second direction, and activating an additional magnetic field gradient for spatial encoding in a third direction, which is orthogonal to said first direction and to said second direction, and reading out the respective echo trains, in each repetition, while said additional magnetic field gradient is activated;

a processor supplied with said raw MR data, said processor being configured to organize data entry points for said raw MR data in k-space represented in said electronic memory along a plurality of parallel k-space lines that each intersect a plane that is orthogonal to each of said k-space lines, with each k-space line intersecting the plane at a respective intersection point;

said processor being configured to enter said raw MR data at respective data entry points along, for each of said echo trains, a k-space trajectory, having a trajectory length TL, that proceeds through a number L of k-space lines in a sequence starting with an i-th k-space line in said number L of k-space lines and ending with an L-th k-space line in said number L of k-space lines;

said processor being configured to automatically set the respective number L of k-space lines associated with each respective echo train in order to cause a sum of all of the respective trajectory lengths of the respective echo trains to be as small as possible, with TL, for each echo train, defined as:

$$TL = \sum_{i=1}^{L-1} \overline{P_i P_{i+1}}$$

wherein Pi is the intersection point of an i-th k-space line of the respective echo train with the plane, and $\overline{P_i P_{i+1}}$ is a length along the trajectory of the respective echo train, from the i-th intersection point to the (i+1)-th intersection point of the respective echo train with the plane; and said processor being configured to make said raw MR data entered into k-space available in electronic form for further processing thereof.

31. A non-transitory, computer-readable data storage medium encoded with programming instructions, said data storage medium being loaded into a computerized control and evaluation system of a magnetic resonance (MR) apparatus, and said programming instructions causing said control and evaluation system to:

receive raw MR data read out as a plurality of echo trains by said MR apparatus;

organize data entry points for said raw MR data in k-space represented in said electronic memory along a plurality of parallel k-space lines that each intersect a plane that is orthogonal to each of said k-space lines, with each k-space line intersecting the plane at a respective intersection point;

enter said raw MR data at respective data entry points along, for each of said echo trains, a k-space trajectory, having a trajectory length TL, that proceeds through a number L of k-space lines in a sequence starting with an i-th k-space line in said number L of k-space lines and ending with an L-th k-space line in said number L of k-space lines;

set the respective number L of k-space lines associated with each respective echo train in order to cause a sum of all of the respective trajectory lengths of the respective echo trains to be as small as possible, with TL, for each echo train, defined as:

$$TL = \sum_{i=1}^{L-1} \overline{P_i P_{i+1}}$$

wherein Pi is the intersection point of an i-th k-space line of the respective echo train with the plane, and $\overline{P_i P_{i+1}}$ is a length along the trajectory of the respective echo train, from the i-th intersection point to the (i+1)-th intersection point of the respective echo train with the plane; and make said raw MR data entered into k-space available in electronic form for further processing thereof.

* * * * *